United States Patent
Otsuki et al.

(10) Patent No.: US 6,737,176 B1
(45) Date of Patent: May 18, 2004

(54) ORGANIC ELECTROLUMINESCENT DEVICE AND METHOD FOR FABRICATING SAME

(75) Inventors: Shigeyoshi Otsuki, Tokyo (JP); Shinichi Fukuzawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/614,874

(22) Filed: Jul. 12, 2000

(30) Foreign Application Priority Data

Jul. 15, 1999 (JP) .......................................... 11-202314

(51) Int. Cl.[7] .............................................. H05B 33/04
(52) U.S. Cl. ......................... 428/690; 428/68; 428/917; 427/66; 313/512; 313/506; 257/99; 257/100
(58) Field of Search ........................... 427/66; 428/690, 428/917, 68; 313/512, 506; 257/99, 100

(56) References Cited

U.S. PATENT DOCUMENTS

| | | | | |
|---|---|---|---|---|
| 4,357,557 A | * | 11/1982 | Inohara et al. | 313/509 |
| 5,189,405 A | * | 2/1993 | Yamashita et al. | 340/781 |
| 5,726,531 A | * | 3/1998 | Hirose et al. | 313/509 |
| 5,814,935 A | * | 9/1998 | Ujihara | 313/504 |
| 5,821,692 A | * | 10/1998 | Rogers et al. | 313/512 |
| 5,920,080 A | * | 7/1999 | Jones | 257/40 |
| 5,981,092 A | * | 11/1999 | Arai et al. | 428/690 |
| 5,990,615 A | * | 11/1999 | Sakaguchi et al. | 313/504 |
| 6,059,860 A | * | 5/2000 | Larson | 95/117 |
| 6,081,071 A | * | 6/2000 | Rogers | 313/512 |
| 6,210,815 B1 | * | 4/2001 | Ooishi | 428/690 |
| 6,284,342 B1 | * | 9/2001 | Ebisawa et al. | 428/690 |

FOREIGN PATENT DOCUMENTS

| | | |
|---|---|---|
| JP | 02-094286 | 4/1990 |
| JP | 05-089958 | 4/1993 |
| JP | 05-315072 | 11/1993 |
| JP | 9-148066 | 6/1997 |
| JP | 09-148066 | * 6/1997 |
| JP | 10-275679 | 10/1998 |
| JP | 10-275682 | 10/1998 |
| JP | 10-312883 | 11/1998 |
| JP | 11-040344 | 2/1999 |
| JP | 2000-195663 | 7/2000 |
| JP | 2000-277254 | 10/2000 |
| KR | 98-12263 | 4/1998 |
| KR | 2000-0009261 | 2/2000 |

* cited by examiner

Primary Examiner—Cynthia H. Kelly
Assistant Examiner—Dawn Garrett
(74) Attorney, Agent, or Firm—Katten Muchin Zavis Rosenman

(57) ABSTRACT

An organic EL device including a stacked structure having an organic luminescent layer positioned between an anode and a cathode; and a sealing can having a desiccant-containing layer on its inner surface. The desiccant in the desiccant-containing layer provides an excellent long-term moisture resistance to the organic EL device, thereby generating no or a few dark spots thereon.

14 Claims, 2 Drawing Sheets

ORGANIC ELECTROLUMINESCENT DEVICE AND METHOD FOR FABRICATING SAME

BACKGROUND OF THE INVENTION (a) Field of the Invention

The present invention relates an organic electroluminescent (hereinafter referred to as "EL") device having an excellent long-term moisture resistance, and a method for fabricating the same.

(b) Description of the Related Art

In a field of a flat display device, an organic EL device including an organic luminescent layer between an anode and a cathode has been conventionally proposed, and researches therefor are actively conducted. However, such an organic EL device is affected by surrounding moisture and has a poor moisture resistance. Ingress of water contents to the interface between the organic luminescent layer and the electrode prevents injection of electrons, thereby generating dark spots showing a non-luminescent region, or corroding the electrodes.

JP-A-10(1998)-312883 describes an organic EL device covered with a buffer layer made of thermoplastic resin and a barrier layer made of an inorganic material. However, in the organic EL device described therein, the ingress of the moisture from the interfaces between the organic EL device and the above layers cannot be sufficiently eliminated. In addition, the EL device has larger dimensions due to these layers. Further, the stress caused by the formation of these layers reduces the luminescent efficiency of the organic EL device or destroys the organic EL device depending on circumstances.

JP-A-10(1998)-275679 describes an organic EL device sealed with sealing glass having a moisture-absorbing porous layer such as a $SiO_2$ layer, a $TiO_2$ layer and a zeolite layer. Since, however, the moisture absorption by the porous layer utilizes only physical adsorption, the influence of the moisture cannot be sufficiently eliminated. In addition, since the surface area of the porous layer is reduced by the inner wall area of the sealing glass, the elimination of the moisture influence for a longer period of time is difficult.

JP-A-9(1997)-148066 describes an organic EL device in which a desiccant maintaining a solid state even after absorbing moisture is fixed in a sealing can by using an adhesive.

Since, however, the amount of the desiccant which can be fixed by the adhesive is restricted by the surface area of the inner wall of the sealing can, the smaller amount of the desiccant cannot effectively eliminate moisture influence for a longer period of time. In addition, since the employable desiccants are limited to one that maintains the solid state even after absorbing moisture, use of a hygroscopic desiccant or a deliquescent desiccant is difficult.

SUMMARY OF THE INVENTION

In view of the foregoing, an object of the present invention is to provide an organic EL device having an excellent long-term moisture resistance and generating less number of dark spots, by using various desiccants in a sufficient amount.

It is another object of the present invention to provide a method for efficiently fabricating such an organic EL device having the excellent long-term moisture resistance.

The present invention provides, in a first aspect thereof, an organic EL device including: a transparent substrate; a stacked structure formed on the transparent substrate, the stacked structure including an anode, a cathode and at least one EL layer sandwiched between the anode and the cathode; a sealing can for encapsulating the stacked structure together with the transparent substrate; and a desiccant-containing layer formed on an inner surface of the sealing can.

The present invention provides, in a second aspect thereof, a method for fabricating en organic EL device including the steps of: forming a stacked structure on a transparent substrate, said stacked structure including an anode, a cathode and at least one organic EL layer sandwiched between the anode and the cathode; forming a desiccant-containing layer on an inner surface of a sealing can; and encapsulating the stacked structure using at least the sealing can.

In accordance with the first and the second aspects of the present invention, since a considerable amount of a desiccant, especially a variety of desiccants, can be contained in the desiccant-containing layer on the sealing can to exclude moisture infiltrated from the interface between the transparent substrate and the sealing can, the organic EL device having an excellent long-term moisture resistance, and especially generating no or a few dark spots, can be provided. In a preferred embodiment thereof, a concave-convex surface formed on the sealing can prevents the release of the desiccant-containing layer from the sealing can to secure the long-term moisture resistance.

Such an organic EL device having the excellent long-term moisture resistance can be fabricated by the method of the present invention. In a preferred embodiment of the method, the desiccant-containing layer forming step and the stacked structure sealing step can be simultaneously conducted to reduce the number of the steps for the fabrication.

The above and other objects, features and advantages of the present invention will be more apparent from the following description.

PREFERRED EMBODIMENTS OF THE INVENTION

Now, the present invention is more specifically described with reference to accompanying drawings.

First Embodiment

Figure 1:
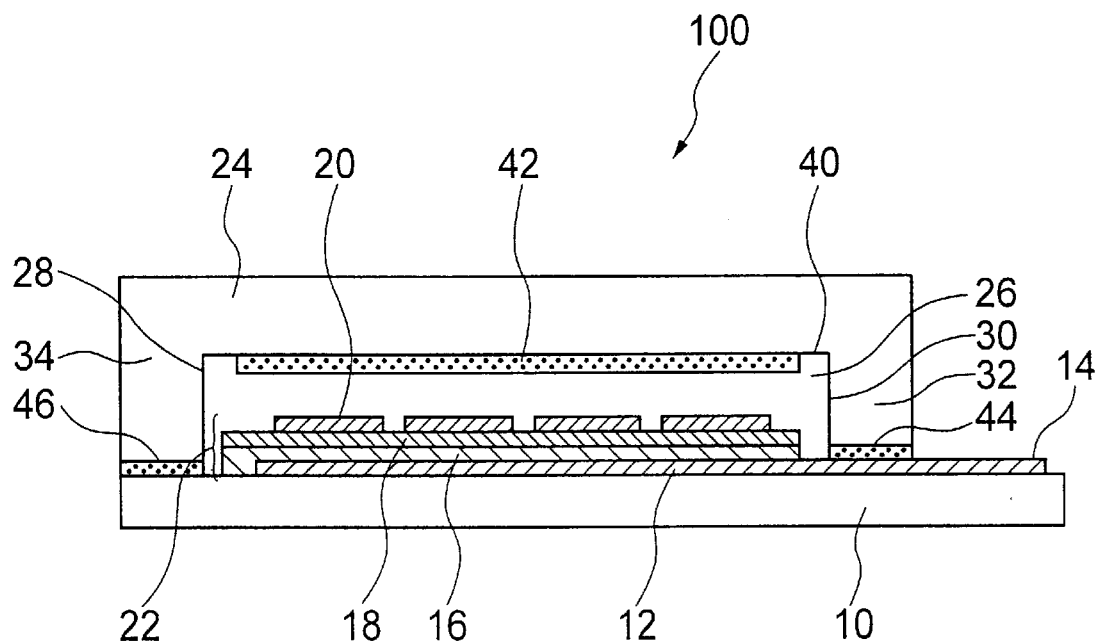
FIG. 1 is a longitudinal sectional view showing an organic EL device in accordance with a first embodiment of the present invention.

An organic EL device 100 of a first embodiment shown in FIG. 1 includes an EL stacked structure 22, or an organic EL thin film layers, including an organic luminescent layer 18 and a hole transport layer 16 sandwiched between an anode 12 and a cathode 20. The stacked structure 22 is sealed between a transparent substrate 10 and a sealing can 24. The organic EL device 100 has a desiccant-containing layer 42 formed on the inner surface 40 of the sealing can 24.

(1) Transparent Substrate

The transparent substrate used in the first embodiment is not especially restricted so long as the transparent substrate supports the stacked structure, allows external emission of light from the stacked structure and shields the interior of the organic EL device from the atmosphere. The transparent substrate is preferably a glass substrate or a transparent polymer substrate because of their excellent light transmittance and the stability and the durability of the resulting organic EL device.

(2) Electrode

At least an anode of the electrodes of the first embodiment preferably has higher light transmittance for effectively allowing the external emission of the light from the organic EL device. Accordingly, the anode is preferably a transparent electrode made of indium-tin oxide compound (ITO) or a translucent electrode made of gold.

The external terminal 14 for connecting the anode 12 to the external circuit is preferably a plated surface made of one or more metals selected from aluminum, nickel, chromium, gold and silver.

The anode preferably has a thickness between 100 and 200 nm because of the effective emission of light from the organic EL device thin film layers and feasibility of fabrication.

On the other hand, the material for the cathode is not especially restricted so long as the material allows efficient injection of electrons and has a stable property. Preferable examples for the material include, for example, magnesium, silver, aluminum, an alloy of silver and lithium, an alloy of magnesium and silver and an alloy of aluminum and lithium. The cathode preferably has a thickness between 100 and 200 nm similarly to the anode.

(3) Organic Luminescent Layer

The material of the organic luminescent layer is not especially restricted so long as the material contains a fluorescent organic material which is luminous upon application of a specified voltage. Examples for the material preferably includes a quinolinol complex, an oxazol complex, various laser pigments and polyparaphenylenevinylene. Among these compounds, use of tris(8-quinolinol) aluminum complex (hereinafter referred to as "Alq$_3$") is more preferable because of its excellent luminescence efficiency.

(4) Hole Transport Layer

The hole transport layer has a function of effectively transporting holes injected from the electrodes to the organic luminescent layer, and is preferably disposed for elevating the luminescence efficiency of the stacked structure. The material of the hole transport layer is not especially restricted so long as the luminescence from the organic luminescent layer effectively transmits through the material. Examples of the material preferably include tetraphenyl-benzidine and N,N'-diphenyl-N,N'-bis(αnaphtyl)-1,1'-biphenyl-4,4'-diamine (hereinafter referred to as "α-NPD).

Preferably, an electron injection layer and an electron transport layer may be formed between the organic luminescent layer and the cathode, and a hole injection layer may be formed between the organic luminescent layer and the anode, other than the hole transport layer, though these layers are not shown in the drawings. A quinolinol complex, an oxazol complex, a triazole complex and a benzoquinolinol complex are suitably used for the materials for the electron transport layer.

(5) Sealing Can

The material and the shape of the sealing can are not especially restricted so long as the sealing can effectively shields the outside air. However, use of glass or a polymer is preferable for improving processability of the inner surface of the sealing can for making unevenness thereon, a bonding property between the desiccant-containing layer and a sealing compound, and the stability and the durability of the organic EL device. The sealing can preferably includes therein a hexahedral cavity having a volume, for example, 1.5 to 10 times that of the stacked structure for easily conducting heat radiation in addition to entirely sealing the stacked structure.

(6) Desiccant-containing Layer

The desiccant-containing layer including a desiccant and resin in a layered structure is formed so that the entire desiccant is not exposed. The desiccant may be mixed with and dispersed in the resin, or a plurality of desiccant layers and resin layers may be superposed to form the desiccant-containing layer.

The desiccant includes, for example, one or more of oxides, halogen compounds, sulfates, perchlorates, carbonates and organic compounds. More concretely, phosphorous pentaoxide ($P_4O_{10}$), barium oxide (BaO), magnesium oxide (MgO), calcium oxide (CaO) or aluminum oxide ($Al_2O_3$) is preferably used. Among these compounds, the phosphorous pentaoxide has a high moisture absorbing ability 35 times that of the barium oxide, and accordingly even a small amount of the phosphorous pentaoxide provides a higher moisture resistance for a longer period of time.

The desiccant is preferably in the shape of particle and uniformly dispersed in the desiccant-containing layer for elevating its moisture absorbing ability and for effectively preventing leakage even when a deliquescent desiccant is used. In this case, the average particle size of the desiccant is preferably 20 $\mu$m or less, and more preferably between 0.1 and 10 $\mu$m.

The resin is not especially restricted and the preferable resin includes vinyl chloride-based resin, phenol-based resin, silicone-based resin, epoxy-based resin, polyester-based resin, urethane-based resin, acryl-based resin and olefin-based resin. The resin can be used in the desiccant-containing layer as a single resin or as a combination thereof.

The resin having an adhesion property, that is, an adhesive is preferably used. The use of the adhesive easily mounts the desiccant-containing layer on the inner surface of the sealing can.

The resin preferably contains another photo-curable resin. The desiccant-containing layer can be mounted on the sealing can in a short period of time by photo-curing the resin in the desiccant-containing layer to reduce a period of fabrication time.

The photo-curable resin which may be cross-linked includes the silicone-based resin, the epoxy-based resin, the acryl-based resin, polybutadiene-based resin and vinyl acetate-based resin. Among these, the polybutadiene-based resin and the vinyl acetate-based resin are preferable because of their high moisture absorbing ability.

A mixed ratio of the desiccant to the resin in the desiccant-containing layer is determined depending on the required moisture resistance for the longer period of time of the organic EL device, and preferably in a range between (1:100) and (100:1) in weight. If the ratio is below 1/100, the moisture resistance for the longer period of time of the organic EL device may decrease, and on the other hand if the ratio is over 100, the formation of the desiccant-containing layer may be difficult.

The mixed ratio is more preferably between (1:10) and (10:1) in weight and most preferably between (1:5) and (5:1) in weight because the moisture resistance for the longer period of time of the organic EL device and the stable formation of the desiccant-containing layer are well-balanced.

The thickness of the desiccant-containing layer can be determined mainly depending on the moisture resistance for the longer period of time of the organic EL device, and is preferably between 0.1 and 1000 μm. If the thickness thereof is below 0.1 μm, the moisture resistance for the longer period of time of the organic EL device may decrease, and on the other hand if the thickness is over 1000 μm, the formation of the desiccant-containing layer may be difficult.

For well-balancing the moisture resistance for the longer period of time of the organic EL device and the stable formation of the desiccant-containing layer, the thickness of the desiccant-containing layer is preferably in a range between 1 and 100 μm, more preferably in a range between 5 and 50 μm.

A desiccant-free layer is preferably disposed on the entire surface or the partial surface of the desiccant-containing layer. The desiccant-free layer effectively prevents leakage of a deliquesced desiccant from the desiccant-containing layer when the deliquescent desiccant is used. Further, if the desiccant physically adsorbed is used, desorption of moisture once adsorbed can be effectively prevented.

The desiccant-free layer is preferably made of resin similar to that added to the desiccant-containing layer, and has a thickness between 0.1 and 1000 μm.

In the first embodiment, as shown in FIG. 1, though the desiccant-containing layer 42 is formed over the cathode 20, the desiccant-containing layer is preferably formed also on side walls 28, 30 of the inner surface of the sealing can 24. The plurality of the desiccant-containing layers effectively absorb the moisture infiltrating through the interface between the sealing can 24 and the transparent substrate 10.

Second Embodiment

Figure 2:
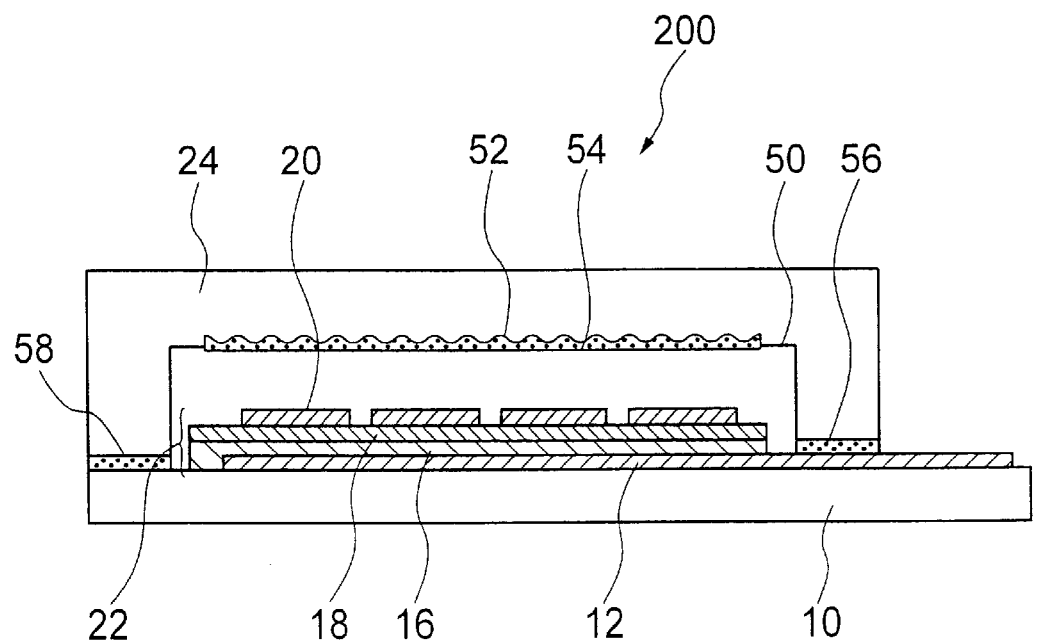
FIG. 2 is a longitudinal sectional view showing an organic EL device in accordance with a second embodiment of the present invention.

A second embodiment shown in FIG. 2 is a modified example of the first embodiment. An organic EL device 200 of the second embodiment includes the stacked structure 22 formed by the organic luminescent layer 18 and the hole transport layer 16 positioned between the anode 12 and the cathode 20. The stacked structure 22 is sealed between the transparent substrate 10 and the sealing can 24. A concave-convex surface 52 is formed on the inner surface 50 of the sealing can 24, and another desiccant-containing layer 54 is formed on the concave-convex surface 52.

The concave-convex surface 52 has an anchoring effect for firmly fixing the desiccant-containing layer to the inner surface of the sealing can. The desiccant-containing layer 54 easily changes its shape in accordance with the concave-convex surface 52 to increase its surface area resulting in elevation of the moisture absorbing ability.

Although the shape of the concave-convex surface 52 is not especially restricted so long as the surface has the above function, a minute concave-convex surface is preferable which is formed in accordance with a method for forming the concave-convex surface described later.

The position of the concave-convex 52 is not especially restricted so long as the position is at least partially superposed with the position of the desiccant-containing layer 54. Another concave-convex may be formed on the surface in contact with the transparent substrate 10 for sealing between the transparent substrate 10 and the sealing can 24 more securely.

A method for forming the concave-convex surface 52 is not restricted so long as the surface functions as required, and includes that for simultaneously forming the sealing can 24 together with the concave-convex surface 52 and that for forming the concave-convex surface 52 after the formation of the sealing can 24.

Third Embodiment

Figure 3:
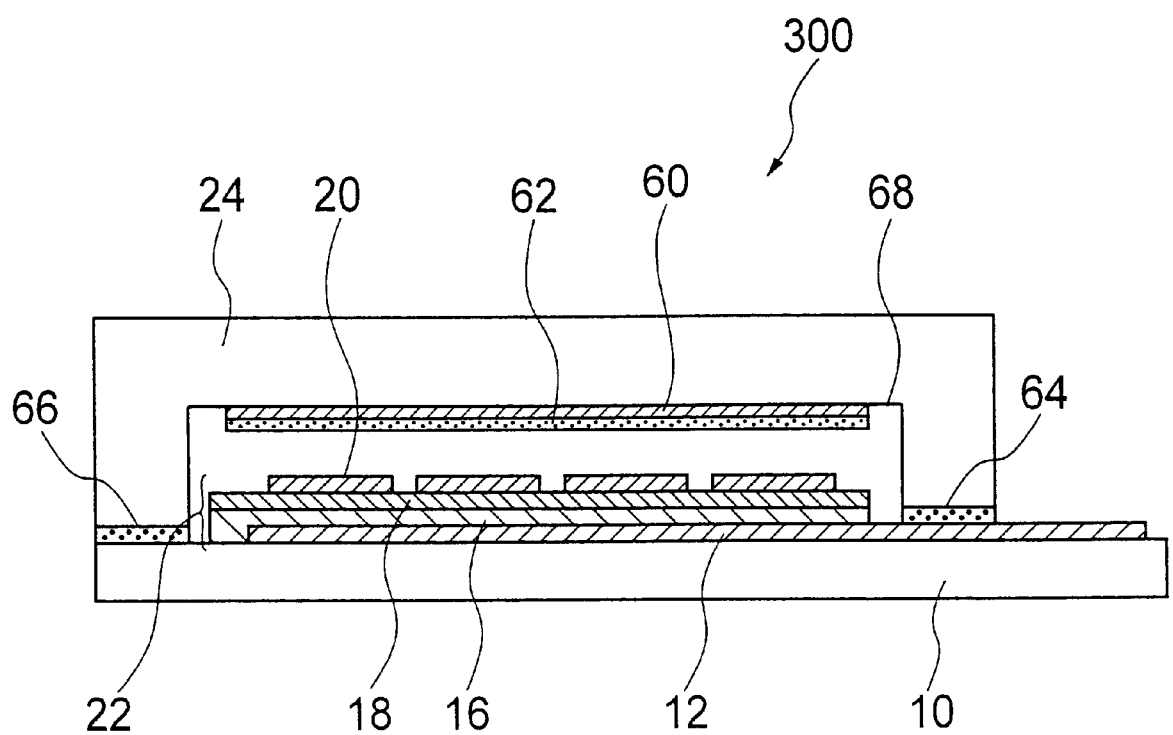
FIG. 3 is a longitudinal sectional view showing an organic EL device in accordance with a third embodiment of the present invention.

A third embodiment shown in FIG. 3 is a modified example of the first embodiment. An organic EL device 300 of the third embodiment includes the stacked structure 22 formed by the organic luminescent layer 18 and the hole transport layer 16 positioned between the anode 12 and the cathode 20. The stacked structure 22 is sealed between the transparent substrate 10 and the sealing can 24. A desiccant-containing layer 62 is layered on the inner surface 68 of the sealing can 24 by using an adhesive 60.

The use of the desiccant-containing layer 62 in the form of a sheet enables the elevation of the effect of the fabricating step, or the attainment of the low-cost fabrication because a significant number of the desiccant-containing layers can be prepared at a time.

The desiccant-containing layer 62 and the adhesive 60 in the third embodiment will be described.

(1) Desiccant-Containing Layer

The desiccant-containing layer 62 used in the third embodiment has the functions similar to those of the above-mentioned desiccant-containing layer, and the material thereof is not especially restricted so long as the efficiency of fabricating the sheet-like layer is not ill influenced.

(2) Adhesive

The adhesive 60 employable in the third embodiment is not especially restricted so long as the adhesive excellently bonds the desiccant-containing layer 62 and the sealing can 24. The preferable adhesive includes vinyl chloride-based resin, phenol-base resin, silicone-based resin, epoxy-based resin, polyester-based resin, urethane-based resin, acryl-based resin, polybutadiene-based resin and vinyl acetate-based resin.

Because of the reason for effective fabrication, the preferable adhesive is the photo-curable resin among the above resins similarly to the case of the sealing compound.

For easily bonding the desiccant-containing layer 62 on the inner surface of the sealing can 24 or for exchanging the desiccant-containing layer 62 when its moisture absorbing ability is reduced, the adhesive having a stripping ability at specified conditions is preferably used.

Although a position to which the adhesive is applied and a method of the application are not especially restricted, preferably the adhesive is applied on one surface of the sheet-like desiccant-containing layer 62, and then the desiccant-containing layer 62 is bonded to the sealing can 24 for implementing the effective fabrication.

An amount of the adhesive 60 depends on the species thereof and the size of the sealing can 24, and the amount is determined so that the thickness of the adhesive is between 1 and 100 μm when the cured adhesive makes a layer between the desiccant-containing layer and the inner surface of the sealing can.

Fourth Embodiment

A fourth embodiment of the present invention is a method for fabricating an organic EL device which seals a stacked structure with a transparent substrate and a sealing can. The stacked structure is formed by an organic luminescent layer positioned between an anode and a cathode. The method includes the following steps.

(1) Step for forming stacked structure
(2) Step for forming desiccant-containing layer on inner surface of sealing can
(3) Step for sealing stacked structure Since the configuration of the organic EL device itself of the fourth embodiment is similar to those of the first to the third embodiments, the description thereof will be omitted.

(1) Step for Forming Organic Luminescent Layer

For forming the stacked structure, an anode is preferably formed on the transparent substrate. When, for example, the anode made of an indium-tin oxide compound (ITO) is fabricated, an ITO film is formed on the entire surface of the transparent substrate by sputtering after the washing of the transparent substrate, and then the ITO film is patterned to a specified pattern by a photolithographic technique.

Then, a hole transport layer, the organic luminescent layer and a cathode are sequentially formed on the anode by a vacuum evaporation process, thereby forming the organic luminescent layer. During the vacuum evaporation deposition process, a metallic mask is preferably used not for depositing an unnecessary film.

(2) Step for Forming Desiccant-containing Layer on Inner Surface of Sealing Can

Before forming the desiccant-containing layer, the sealing can is preferably formed. The sealing can, in case of using glass, can be formed by a step of molding the glass over a glass-melting temperature or a glass-transition temperature, or by another step of chemically etching the glass.

Then, a concave-convex surface is formed on the inner surface of the sealing can thus obtained.

The concave-convex surface may be formed by a sandblast method or an etching method. The sandblast method is carried out by, for example, blasting metal particles such as aluminum powder, sand or other abrasive powder to form the minute concave-convex surface on the inner surface of the sealing can.

Advantageously, the sandblast method can simultaneously form the sealing can having the external cover and the concave-convex surface on the sealing can.

The etching method forms the concave-convex surface by a corrosive effect of chemicals, preferably alkaline chemicals which may be selected depending on the material of the sealing can.

Then, the desiccant-containing layer is formed on the inner surface of the sealing can. A preferable method includes the following two methods, and is not restricted thereto.

A first method includes application of the mixture of a desiccant and resin to the inner surface of the sealing can to directly form the desiccant-containing layer. The first method is conducted by applying the mixture by means of a spray method, a screen printing method or a pad printing method. The first method enables the formation of the relatively thin desiccant-containing layer.

In the first method, after the application of the mixture, the resin in the desiccant-containing layer is preferably cured by heating or exposure to light in addition to its drying. The curing enables the layering of the desiccant-containing layer on the inner surface of the sealing can with the higher bonding strength.

Further in the first method, reduction of the number of the steps can be realized by means of the simultaneous photo-curing of the desiccant-containing layer and the sealing can by adding the photo-cured adhesive to the sealing can as a sealing agent, as well as to the desiccant-containing layer.

A second method of forming the desiccant-containing layer is to indirectly form the desiccant-containing layer molded in a sheet-like shape in advance on the inner surface of the sealing can. More concretely, after the mixture is applied in advance on a release film by using a screen printing method, the release film is cut to a specified size, which is then layered on the inner surface of the sealing can by using the adhesive or a screw.

In accordance with the second method, reduction of the cost can be attained because the large sheet-like desiccant-containing layer is formed at a time. Also in the second method similarly to the first method, reduction of the number of the steps can be realized by means of the simultaneous photo-curing of the desiccant-containing layer and the sealing can.

When the desiccant-containing layer is layered on the inner surface of the sealing can, the resin in the desiccant-containing layer is preferably cured in advance by heating or exposure to light. Thereby, moisture absorption by the desiccant before the layering of the desiccant-containing layer is effectively prevented.

(3) Step for Sealing Stacked Structure

The sealing between the transparent substrate having the stacked structure mounted thereon and the sealing can is preferably conducted by the sealing compound.

Concretely, after the adhesive is applied to the outer periphery of the sealing can, the positions of the transparent substrate and the sealing can are determined to seal the organic EL device in the sealing can, and the transparent substrate and the sealing can are bonded for sealing.

The adhesive may be applied onto the corresponding part of the transparent substrate bonded with the sealing can, in place of the sealing can. Because of preventing the deterioration of the organic EL device in the curing step, the employable adhesive desirably has a low curable temperature and a low gas permeability, for example, an epoxy-based photo-curable adhesive.

The space formed inside of the organic EL device may be filled with a gaseous or liquid inert substance such as nitrogen, argon, a fluorine-containing hydrocarbon compound and a silicone-based compound during the sealing of the organic EL device. The filling of the inert substance further elevates the long-term moisture resistance of the organic EL device.

The filling of the inert substance can be conducted in a chamber having the same inert substance therein.

EXAMPLE 1

(1) Step for Forming Stacked Structure

After an indium-tin oxide compound (ITO) having a thickness of about 150 nm was deposited by sputtering as an anode on a glass substrate washed in advance, the ITO was patterned by using the photolithographic technique. On the anode, a hole transport layer made of α-NPD having a thickness of 200 nm and an organic luminescent layer made of $Alq_3$ having a thickness of 200 nm were sequentially deposited by using a vacuum evaporation method (degree of vacuum: less than $10^{-4}$ Pa).

Then, by employing a metallic mask having an opening pattern intersecting the anode, a cathode was formed by the simultaneous vacuum evaporation of magnesium and silver on the organic luminescent layer. The vacuum evaporation was continued until the cathode thickness reached to 100 nm while the thickness ratio between the magnesium and the gold was adjusted to be about 10:1.

(2) Step for Forming Concave-convex Surface and Desiccant-containing Layer on Sealing Can A glass plate having a thickness of 0.5 mm was sand-blasted using aluminum powder having a particle size of #600 to provide the sealing can having a convex portion of a depth of about 0.2 mm and to form minute concave-convex on the inner surface of the sealing can.

Then, phosphorus pentaoxide powder having an average particle size of about 10 μm and a lower temperature-curable epoxy-based adhesive were mixed in dry nitrogen in a weight ratio of 3:1 to provide a mixture. The mixture was sprayed onto the inner surfaced of the sealing can followed by heating to provide the desiccant-containing layer having a thickness of about 100 μm.

(3) Step for Sealing by Sealing Can

An epoxy-based photo-curable adhesive was applied as a sealing compound onto the outer periphery of the sealing can in dry nitrogen. Then, the positions of the glass substrate having the stacked structure thereon and the sealing can were determined. Thereafter, ultraviolet rays were irradiated to the photo-curable adhesive to be cured for sealing, and the organic EL device was thus obtained.

(4) Evaluation of Organic EL Device

The organic EL devices thus obtained were allowed to stand under conditions of a high temperature and a high humidity (60° C. and 95% RH) for 500 hours or 1000 hours, and thereafter, a voltage was applied for driving. Upon observation of the resulting organic EL devices, no dark spots were generated.

Since the above embodiments are described only for examples, the present invention is not limited to the above embodiments and various modifications or alternations can be easily made therefrom by those skilled in the art without departing from the scope of the present invention.

What is claimed is:

1. An organic EL device comprising:
   a transparent substrate;
   a stacked structure formed on the transparent substrate, the stacked structure including an anode, a cathode and at least one organic EL layer sandwiched between the anode and the cathode;
   a sealing can for encapsulating the stacked structure together with the transparent substrate;
   a desiccant-containing layer adhesively formed on an inner surface of the sealing can, so that a gap is defined between said desiccant-containing layer and the stacked structure; and
   a desiccant-free layer being disposed on at least a part of a surface of said desiccant-containing layer.

2. An organic EL device comprising:
   a transparent substrate;
   a stacked structure formed on the transparent substrate, the stacked structure including an anode, a cathode and at least one organic EL layer sandwiched between the anode and the cathode;
   a sealing can for encapsulating the stacked structure together with the transparent substrate; and
   a desiccant-containing layer adhesively formed on an inner surface of the sealing can, so that a gap is defined between said desiccant-containing layer and the stacked structure, wherein the gap defines a cavity in the sealing can having a volume of between 1.5 and 10 times larger than a volume defined by the stacked structure.

3. The organic EL device as defined in claim 2, wherein the desiccant-containing layer contains an adhesive.

4. The organic EL device as defined in claim 2, wherein the desiccant-containing layer contains, as a desiccant, at least one compound selected from the group consisting of phosphorous pentaoxide ($P_4O_{10}$), barium oxide (BaO), magnesium oxide (MgO), calcium oxide (CaO) and aluminum oxide ($Al_2O_3$).

5. The organic EL device as defined in claim 2, wherein the desiccant is dispersed within the desiccant-containing layer.

6. The organic EL device as defined in claim 5, wherein the desiccant is uniformly dispersed within the desiccant-containing layer.

7. The organic EL device as defined in claim 2, wherein the desiccant is a deliquescent desiccant.

8. A method for fabricating an organic EL device comprising the steps of:
   forming a stacked structure on a transparent substrate, said stacked structure including an anode, a cathode and at least one organic EL layer sandwiched between the anode and the cathode;
   forming a desiccant-containing layer on an inner surface of a sealing can, a desiccant-free layer being disposed on at least part of a surface of said desiccant-containing layer; and
   encapsulating the stacked structure using at least the sealing can, so that a gap is defined between said desiccant-containing layer and the stacked structure; at least one surface of the cathode being exposed to at least one gas in an interior of the sealing can.

9. A method for fabricating an organic EL device comprising the steps of:
   forming a stacked structure on a transparent substrate, said stacked structure including an anode, a cathode and at least one organic EL layer sandwiched between the anode and the cathode;
   forming a concave-convex surface on the inner surface of a sealing can;
   forming a desiccant-containing layer on the concave-convex surface of the sealing can, said desiccant-containing layer being formed in such a manner that a surface area of said desiccant-containing layer is not entirely composed of desiccant;
   encapsulating the stacked structure using at least the sealing can; at least one surface of the cathode being exposed to at least one gas in an interior of the sealing can.

10. A method for fabricating an organic EL device comprising the steps of:
    forming a stacked structure on a transparent substrate, said stacked structure including an anode, a cathode and at least one organic EL layer sandwiched between the anode and the cathode;
    forming a desiccant-containing layer on an inner surface of a sealing can; and
    encapsulating the stacked structure using at least the sealing can, so that a gap is defined between said desiccant-containing layer and the stacked structure; at least one surface of the cathode being exposed to at least one gas in an interior of the sealing can, wherein the gap defines a cavity in the sealing can having a volume of between 1.5 and 10 times larger than a volume defined by the stacked structure.

11. The method as defined in claim 10, the desiccant-containing layer forming step includes bonding the desiccant containing layer onto the inner surface.

12. A method for fabricating an organic EL device comprising the steps of:
    forming a stacked structure on a transparent substrate, said stacked structure including an anode, a cathode and at least one organic EL layer sandwiched between the anode and the cathode;
    forming a desiccant-containing layer on an inner surface of a sealing can; and
    encapsulating the stacked structure using at least the sealing can, so that a gap is defined between said desiccant-containing layer and the stacked structure; at least one surface of the cathode being exposed to at least one gas in an interior of the sealing can, wherein said desiccant-containing layer is formed to have a surface layer that is substantially desiccant-free.

13. The method as defined in claim 12, the steps of forming the desiccant-containing layer and encapsulating the stacked structure are conducted in one step.

14. An organic EL device comprising:
- a transparent substrate;
- a stacked structure formed on the transparent substrate, the stacked structure including an anode, a cathode and at least one organic EL layer sandwiched between the anode and the cathode;
- a sealing can for encapsulating the stacked structure together with the transparent substrate; and
- a desiccant-containing layer adhesively formed on an inner surface of the sealing can, so that a gap is defined between said desiccant-containing layer and the stacked structure, wherein said desiccant-containing layer has a surface layer that is substantially desiccant-free.

* * * * *